(12) United States Patent
Cheng et al.

(10) Patent No.: US 11,569,329 B2
(45) Date of Patent: Jan. 31, 2023

(54) ARRAY SUBSTRATE AND DETECTION METHOD THEREFOR, DISPLAY PANEL AND DISPLAY DEVICE

(71) Applicants: Beijing BOE Technology Development Co., Ltd., Beijing (CN); BOE Technology Group Co., Ltd., Beijing (CN)

(72) Inventors: Hongfei Cheng, Beijing (CN); Xueguang Hao, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 504 days.

(21) Appl. No.: 16/621,416

(22) PCT Filed: May 30, 2019

(86) PCT No.: PCT/CN2019/089333
§ 371 (c)(1),
(2) Date: Dec. 11, 2019

(87) PCT Pub. No.: WO2020/038041
PCT Pub. Date: Feb. 27, 2020

(65) Prior Publication Data
US 2020/0388664 A1 Dec. 10, 2020

(30) Foreign Application Priority Data
Aug. 24, 2018 (CN) .......................... 201810973788.2

(51) Int. Cl.
*G09G 3/00* (2006.01)
*H01L 27/32* (2006.01)

(52) U.S. Cl.
CPC ......... *H01L 27/3276* (2013.01); *G09G 3/006* (2013.01); *H01L 27/3211* (2013.01)

(58) Field of Classification Search
CPC ... H01L 27/3276; H01L 27/3211; G09F 3/006
See application file for complete search history.

(56) References Cited

U.S. PATENT DOCUMENTS 11,011,085 B2 * 5/2021 Lee ..................... H01L 27/3276
2014/0176844 A1 6/2014 Yanagisawa
(Continued)

FOREIGN PATENT DOCUMENTS

CN 107464512 A 12/2017
CN 107658233 A 2/2018
(Continued)

OTHER PUBLICATIONS

Extended Search Report for European Application No. 19835226.2 dated Apr. 14, 2022.

*Primary Examiner* — Minh Q Phan
(74) *Attorney, Agent, or Firm* — ArentFox Schiff LLP; Michael Fainberg

(57) ABSTRACT

The present disclosure discloses an array substrate and a detection method therefor, a display panel, and a display device. The array substrate includes: a base substrate, wherein the base substrate has a display area and a peripheral area surrounding the display area; a plurality of sub-pixel units, wherein the plurality of sub-pixel units are arrayed in the display area; a plurality of data lines, wherein the data lines are electrically connected to the sub-pixel units in corresponding columns; at least one first switching transistor, wherein the first switching transistor is located at a first side of the peripheral area, a drain of the first switching transistor is electrically connected to one of the data lines, and the data line connected to the drain of the first switching (Continued)

transistor is a first data line; a gate control line; and at least one detection line.

17 Claims, 14 Drawing Sheets

(56) References Cited

U.S. PATENT DOCUMENTS

| | | | |
|---|---|---|---|
| 2018/0033354 A1 | 2/2018 | Lee et al. |
| 2018/0033355 A1 | 2/2018 | Lee et al. |
| 2018/0053792 A1 | 2/2018 | Shin et al. |

FOREIGN PATENT DOCUMENTS

| | | | |
|---|---|---|---|
| CN | 107680481 A | 2/2018 |
| CN | 108417561 A | 8/2018 |

* cited by examiner

ARRAY SUBSTRATE AND DETECTION METHOD THEREFOR, DISPLAY PANEL AND DISPLAY DEVICE

This application is a US National Stage of International Application No. PCT/CN2019/089333, filed on May 30, 2019, which claims priority to Chinese Patent Application No. 201810973788.2, filed to the Chinese Patent Office on Aug. 24, 2018, and entitled "ARRAY SUBSTRATE AND DETECTION METHOD THEREFOR, AND DISPLAY DEVICE", which is incorporated herein by reference in its entirety.

FIELD

The present disclosure relates to the field of display techniques, and more particularly to an array substrate and a detection method therefor, a display panel, and a display device.

BACKGROUND

At present, Organic Light-Emitting Diode (OLED) devices are considered to be the most promising flat panel display devices, and are also considered to be the display technique most likely to make flexible display devices.

A flexible display device is fabricated by using a flexible substrate, but edges of the flexible substrate tend to form cracks. The cracks will expand toward a display area. When the cracks expand to the display area, water and oxygen will enter the display area through the cracks, thereby affecting the service life of a flexible display panel.

SUMMARY

In a first aspect, an embodiment of the present disclosure provides an array substrate, including:

a base substrate, wherein the base substrate has a display area and a peripheral area surrounding the display area;

a plurality of sub-pixel units, wherein the plurality of sub-pixel units are arrayed in the display area;

a plurality of data lines, wherein the data lines are electrically connected to the sub-pixel units in corresponding columns;

at least one first switching transistor, wherein the at least one first switching transistor is at a first side of the peripheral area, a drain of the first switching transistor is electrically connected to one of the data lines, and the one of the data lines connected to the drain of the first switching transistor is a first data line;

a gate control line, wherein the gate control line is at the first side of the peripheral area, and the gate control line is electrically connected to a gate of the first switching transistor; and at least one detection line, wherein the at least one detection line is at least at the first side and a second side of the peripheral area, the first side and the second side are adjacent sides, and the at least one detection line is electrically connected to a source of the at least one first switching transistor.

Optionally, in the array substrate according to an embodiment of the present disclosure, the at least one first switching transistor is at a first end of the corresponding first data line.

The at least one detection line includes a first segment extending from the first end of the first data line along the first side, the second side and a third side of the peripheral area to a second end of the first data line, and the third side is a side opposite to the first side.

Optionally, in the array substrate according to an embodiment of the present disclosure, a signal input end of the at least one detection line is at the first side; the at least one detection line further includes a second segment extending from the second end of the first data line along the third side, the second side and the first side of the peripheral area to the signal input end.

Optionally, in the array substrate according to an embodiment of the present disclosure, a part of the at least one detection line at the second side of the peripheral area is provided with a plurality of circuitous trace portions.

Optionally, in the array substrate according to an embodiment of the present disclosure, the circuitous trace portions are at the second segment.

Optionally, in the array substrate according to an embodiment of the present disclosure, the peripheral area is provided with one detection line.

The first segment and the second segment of the at least one detection line at least surround the display area by one circle.

Optionally, in the array substrate according to an embodiment of the present disclosure, a part of the first segment at the first side of the peripheral area is distributed circuitously.

Optionally, in the array substrate according to an embodiment of the present disclosure, the peripheral area is provided with two detection lines.

The first segment and the second segment of each of the detection lines are at the same side of the peripheral area.

Optionally, in the array substrate according to an embodiment of the present disclosure, the two detection lines are symmetrically disposed.

Optionally, in the array substrate according to an embodiment of the present disclosure, the same detection line is electrically connected to sources of a plurality of first switching transistors.

Optionally, in the array substrate according to an embodiment of the present disclosure, sub-pixel units electrically connected to at least one first data line are green sub-pixel units.

Optionally, the array substrate according to an embodiment of the present disclosure further includes: second switching transistors in the peripheral area and corresponding to the data lines except at least one first data line.

Wherein sources of the second switching transistors are electrically connected to a display detection power supply line, gates of the second switching transistors are electrically connected to the gate control line, and drains of the second switching transistors are electrically connected to corresponding data lines.

Optionally, in the array substrate according to an embodiment of the present disclosure, the first switching transistors and the second switching transistors are at the first side of the peripheral area.

Optionally, in the array substrate according to an embodiment of the present disclosure, each of the first switching transistors is electrically connected to the corresponding detection line through a selection control circuit.

The selection control circuit is configured to control the sources of the first switching transistors to be connected with the detection lines when whether the array substrate has cracks or not is detected, and to control the sources of the first switching transistors to be connected with the display detection power supply line when whether the array substrate displays normally or not is detected.

Optionally, in the array substrate according to an embodiment of the present disclosure, the display detection power supply line is in parallel with the gate control line.

In a second aspect, an embodiment of the present disclosure further provides a detection method for the array substrate according to the first aspect, including:

applying a detection signal of a preset voltage to the at least one detection line, and applying a gate control signal to the gate control line, wherein a difference between a voltage of the gate control signal and the preset voltage is less than a threshold voltage of the at least one first switching transistor;

determining that the array substrate has cracks when the sub-pixel units electrically connected to the at least one first data line emit light, and determining that the array substrate does not have cracks when the sub-pixel units electrically connected to the at least one first data line do not emit light.

In a third aspect, an embodiment of the present disclosure further provides a display panel, including the array substrate according to the first aspect.

Optionally, in the display panel according to an embodiment of the present disclosure, the display panel is an organic electroluminescence display panel.

In a fourth aspect, an embodiment of the present disclosure further provides a display device, including the display panel according to the third aspect according to an embodiment of the present disclosure.

DETAILED DESCRIPTION

Figure 1:
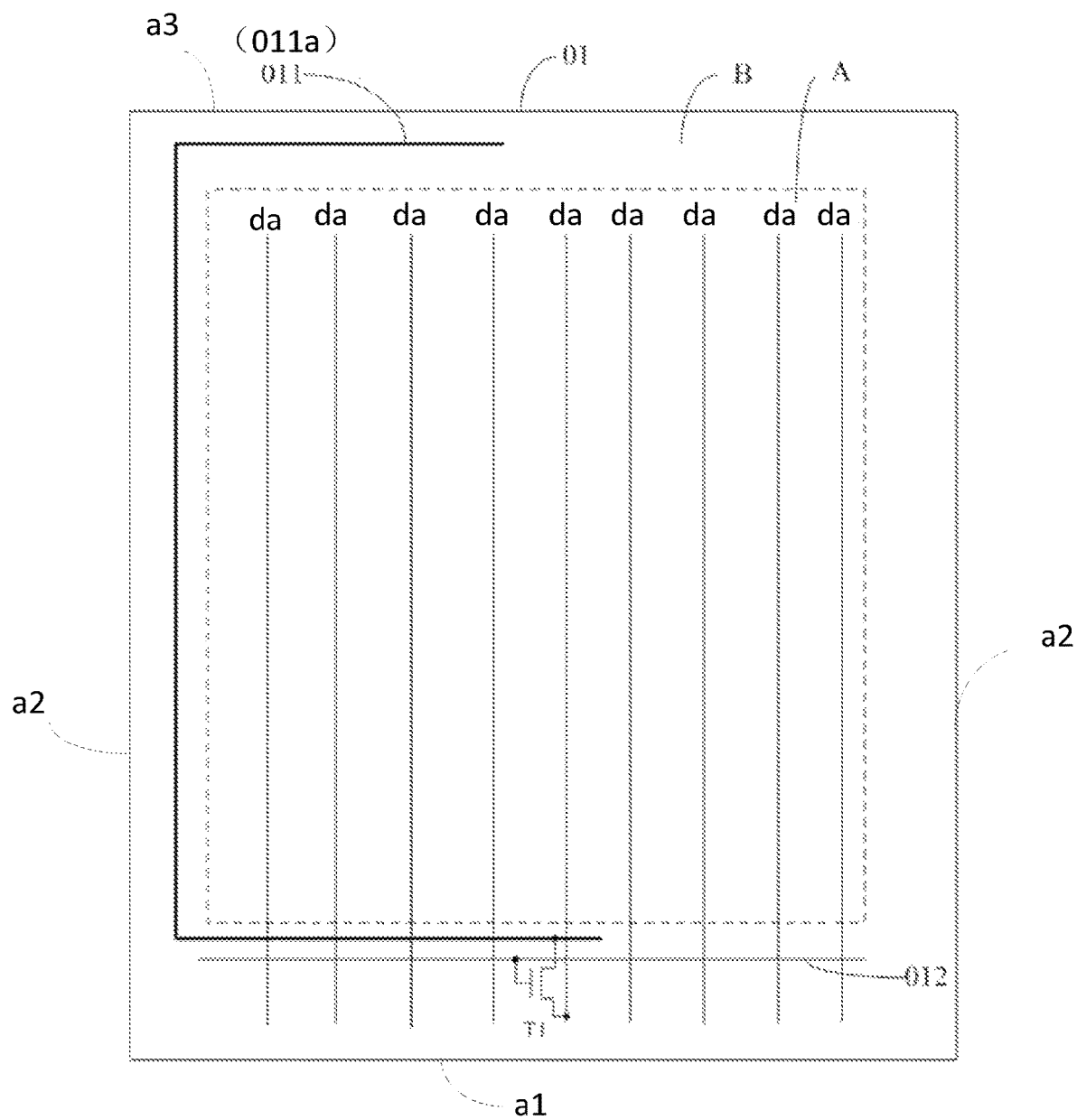
FIG. 1 is a first schematic structural diagram of an array substrate in accordance with an embodiment of the present disclosure.
Figure 2:
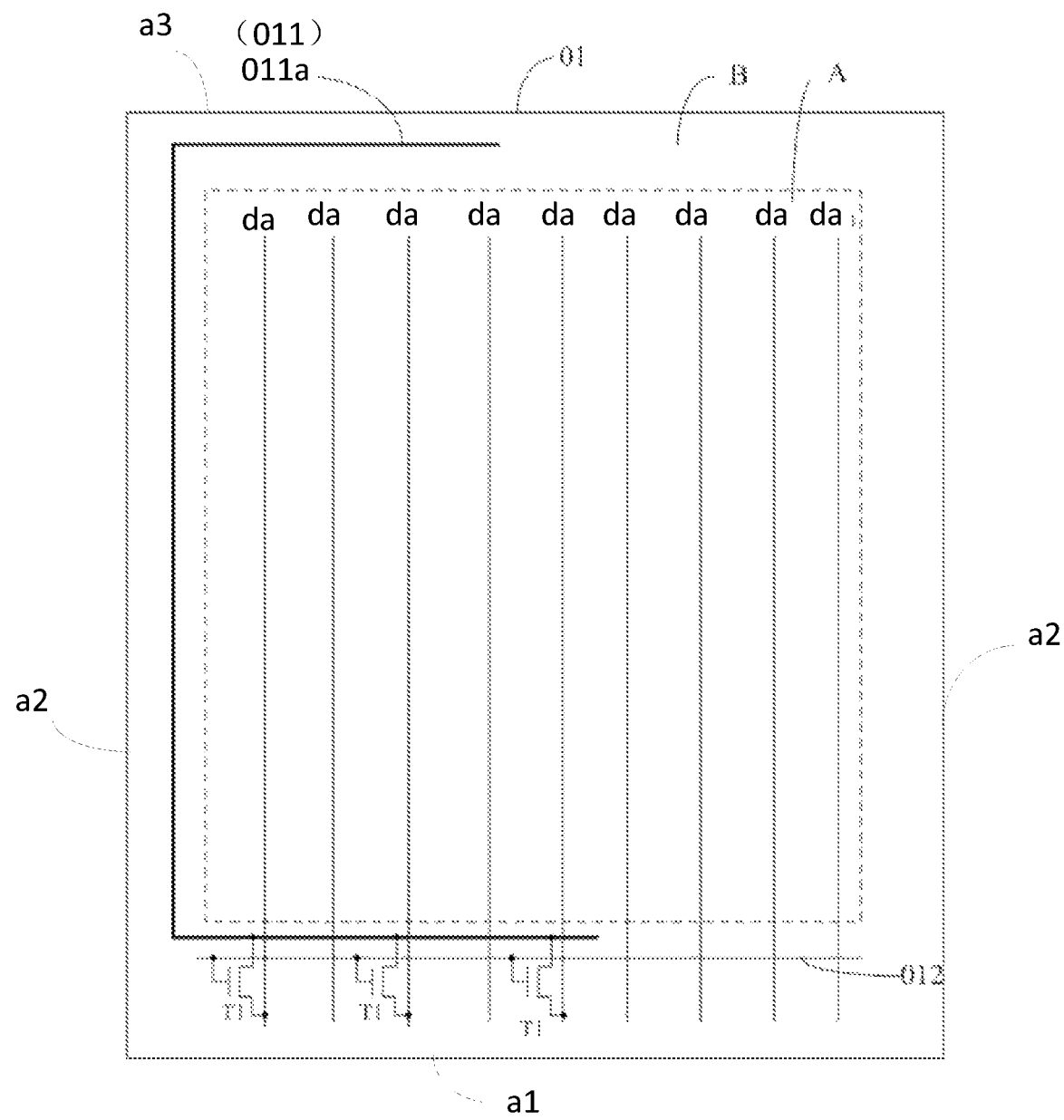
FIG. 2 is a second schematic structural diagram of an array substrate in accordance with an embodiment of the present disclosure.
Figure 3:
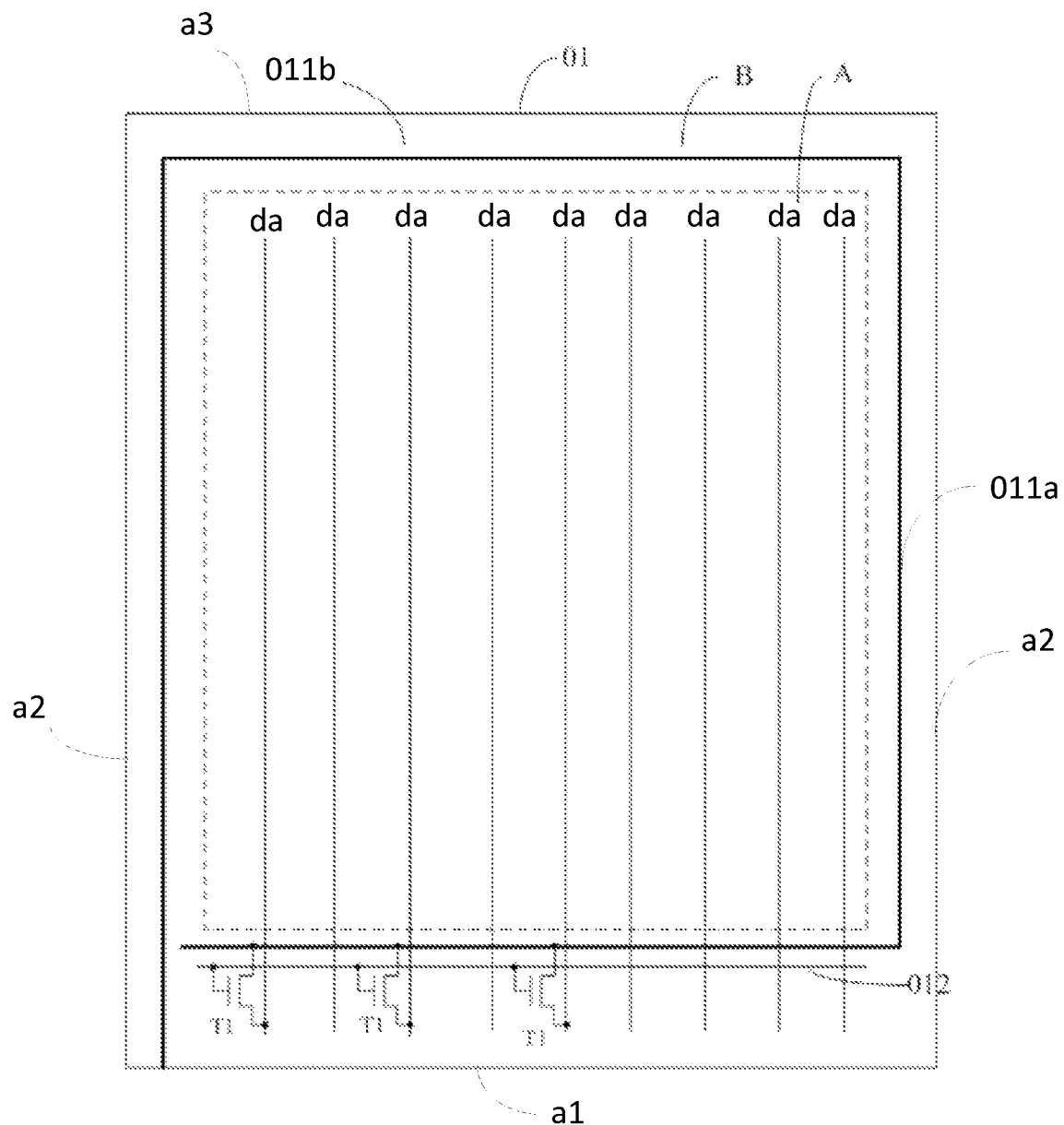
FIG. 3 is a third schematic structural diagram of an array substrate in accordance with an embodiment of the present disclosure.

In order to make the object, technical solution and advantages of the present disclosure clearer, the present disclosure will be further described in detail in conjunction with the drawings. Obviously, the described embodiments are merely part of embodiments of the present disclosure, rather than all embodiments. On the basis of the embodiments of the present disclosure, all other embodiments obtained by a person of ordinary skill in the art without inventive efforts fall within the protection scope of the present disclosure.

The shapes and sizes of various components in the drawings do not reflect true proportions, and are merely intended to illustrate the present disclosure.

An embodiment of the present disclosure provides an array substrate, as shown in FIG. 1 to FIG. 10, including:

a base substrate 01, wherein the base substrate 01 has a display area A and a peripheral area B surrounding the display area A;

a plurality of sub-pixel units (not shown in the figure), wherein the plurality of sub-pixel units are arrayed in the display area A;

a plurality of data lines da, wherein each data line da is electrically connected to the sub-pixel units in a corresponding column;

at least one first switching transistor T1, wherein the first switching transistor T1 is located at a first side of the peripheral area, a drain of the first switching transistor T1 is electrically connected to one of the data lines da, and the data line da connected to the drain of the first switching transistor T1 is a first data line;

a gate control line 012, wherein the gate control line 012 is located at the first side a1 of the peripheral area, and the gate control line 012 is electrically connected to a gate of the first switching transistor T1; and at least one detection line 011, wherein the at least one detection line 011 is at least located at the first side a1 and a second side a2 of the peripheral area, the first side a1 and the second side a2 are adjacent sides, and the at least one detection line 011 is electrically connected to a source of the first switching transistor T1.

According to the array substrate according to the embodiment of the present disclosure, at least one detection line and at least one first switching transistor electrically connected to the detection line are arranged in the peripheral area, the source of the first switching transistor is electrically connected to the detection line, the drain of the first switching transistor is electrically connected to the first data line, and the gate of the first switching transistor is electrically connected to the gate control line. When whether the array substrate has cracks or not needs to be detected, a detection signal of a preset voltage is applied to the detection line, and a gate control signal is applied to the gate control line, wherein a difference between a voltage of the gate control signal and the preset voltage is less than a threshold voltage of the first switching transistor; when the array substrate has cracks in an area where the detection line passes, the detection line is thinned with the crack, so that the resistance on the detection line becomes larger, and the voltage applied to the source of the first switching transistor becomes smaller to cause the first switching transistor to be turned on, so the sub-pixel units electrically connected to the first data line emit light; when the array substrate does not have cracks in an area where the detection line passes, the first switching transistor is turned off, so the sub-pixel units electrically connected to the first data line do not emit light. Therefore, whether the array substrate has cracks or not is detected by the fact that the resistance on the detection line may change with the crack.

Optionally, in the array substrate according to an embodiment of the present disclosure, as shown in FIG. 1 to FIG. 10, the first switching transistor T1 is located at a first end of the corresponding first data line.

The detection line 011 includes a first segment 011a extending from the first end of the first data line along the first side a1, the second side a2 and a third side a3 of the peripheral area B to a second end of the first data line, where the third side a3 is a side opposite to the first side a1. In this way, it can be at least ensured that the detection line can detect a side of the array substrate in the direction of data line.

During specific implementation, in the array substrate according to an embodiment of the present disclosure, the detection line is generally a metal trace.

Specifically, in the array substrate according to an embodiment of the present disclosure, as shown in FIG. 2 to FIG. 7, the same detection line 011 may be connected to sources of a plurality of first switching transistors T1. Within a certain range, the more data lines connected to the detection line are, that is, the more the first switching transistors arranged are, the higher the stability of the detection result is.

Optionally, in the array substrate according to an embodiment of the present disclosure, as shown in FIG. 3 to FIG. 10, an end of the detection line 011 used for receiving a detection signal is led out from the first side a1 of the peripheral area B provided with the first switching transistors T1. The side provided with the first switching transistors T1 is generally used to be provided with a driving circuit, so that the end of the detection line 011 used for receiving the detection signal is led out from the side provided with the driving circuit, and it is convenient to apply the detection signal to the detection line.

Specifically, the gate control line is connected to the gate of the first switching transistor. In order to facilitate wiring, optionally, in the array substrate according to an embodiment of the present disclosure, as shown in FIG. 1 to FIG. 10, the gate control line 012 is located at the first side a1 of the peripheral area B, that is, the gate control line 012 is located on the side of the peripheral area B provided with the first switching transistor.

Figure 6:
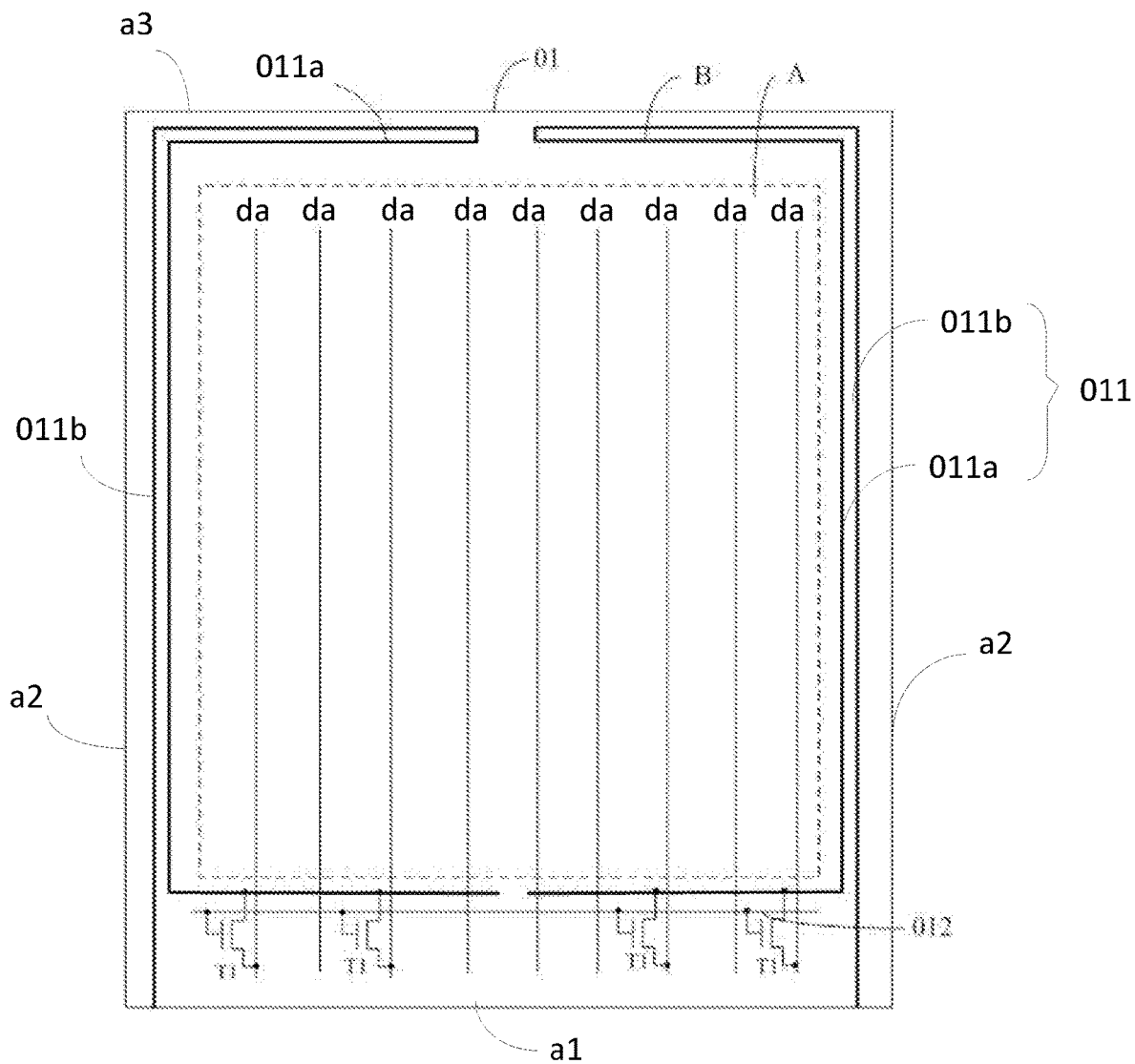
FIG. 6 is a sixth schematic structural diagram of an array substrate in accordance with an embodiment of the present disclosure.

Optionally, in the array substrate according to an embodiment of the present disclosure, as shown in FIG. 6, the signal input end(s) of the detection line(s) is located at the first side a1; the detection line further include: a second segment 011b extending from the second end of the first data line along the third side a3, the second sides a2 and the first side a1 of the peripheral area to the signal input end.

When one detection line only surrounds the display area by a half circle, and the signal input end of the detection line and the first switching transistor are both disposed on the first side, the second segment of the detection line is required to implement the detection function. In addition, the arrangement of the second segment increases the effective area of the detection line, and can improve the detection accuracy.

Figure 7:
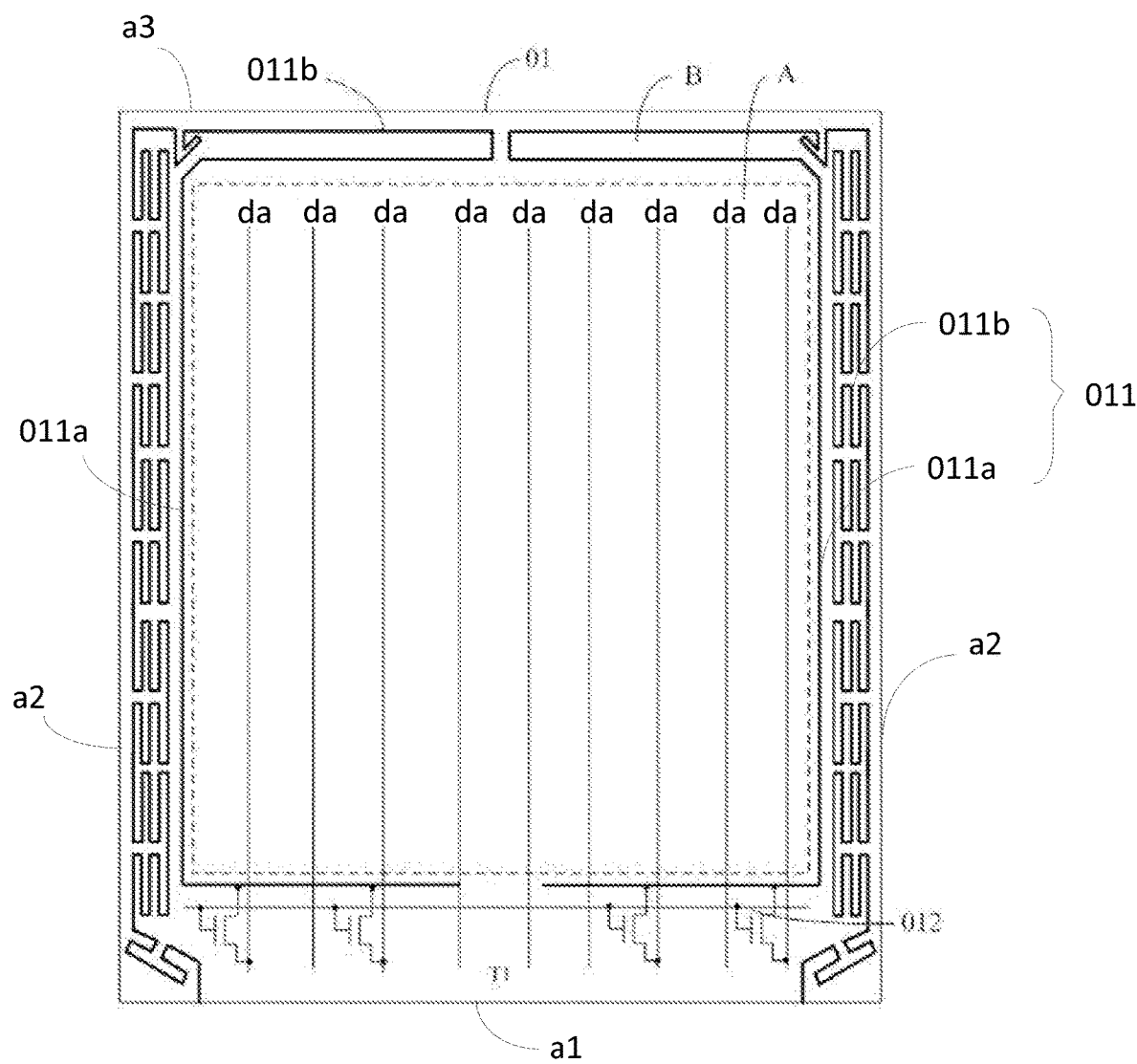
FIG. 7 is a seventh schematic structural diagram of an array substrate in accordance with an embodiment of the present disclosure.

Optionally, in the array substrate according to an embodiment of the present disclosure, as shown in FIG. 7, the parts of the detection lines 011 located at the second sides a2 of the peripheral area are provided with a plurality of circuitous trace portions.

The arrangement of the circuitous trace portions can further increase the detection accuracy of the detection line. When the area occupied by the detection line in the peripheral area is larger and there are cracks, a resistance change on the detection line is more obvious, and the detection accuracy is higher.

Optionally, in the array substrate according to an embodiment of the present disclosure, as shown in FIG. 7, the circuitous trace portions are located at the second segments 011b.

The possibility that cracks occur is higher at positions closer to edges of the array substrate. Therefore, the circuitous trace portions are disposed at the second segment of the detection line, i.e., at positions close to edges of the array substrate, and cracks at the positions close to the edges can be effectively detected, so that measures can be taken to prevent the water and oxygen from affecting the display area.

During specific implementation, in the array substrate according to an embodiment of the present disclosure, cracks can be detected only when the detection line passes through the cracks. Therefore, in order to effectively detect cracks in one circle of the peripheral area of the array substrate, the detection line may be arranged such that the first segment and the second segment at least surround the display area by one circle.

Figure 4:
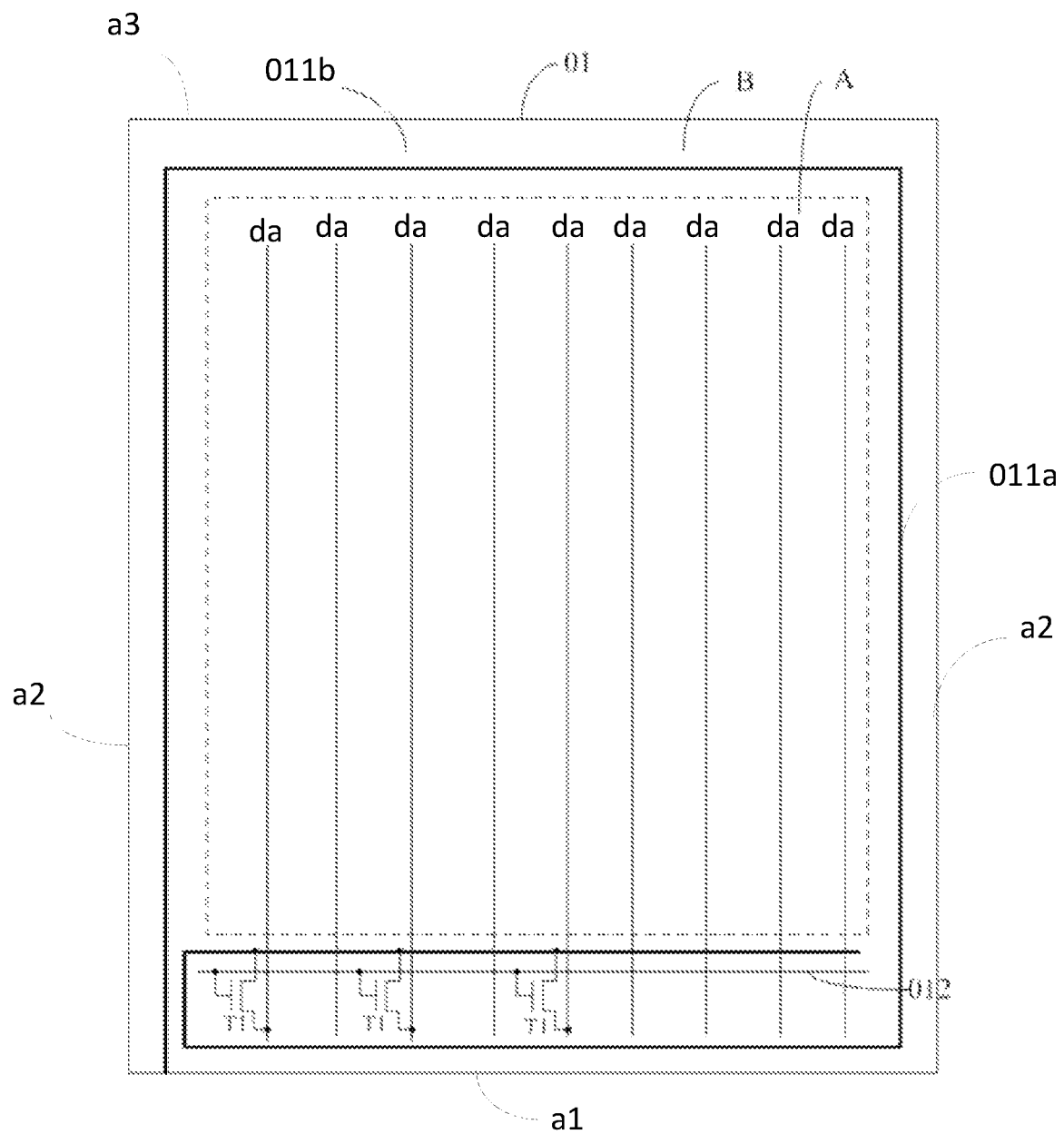
FIG. 4 is a fourth schematic structural diagram of an array substrate in accordance with an embodiment of the present disclosure.
Figure 5:
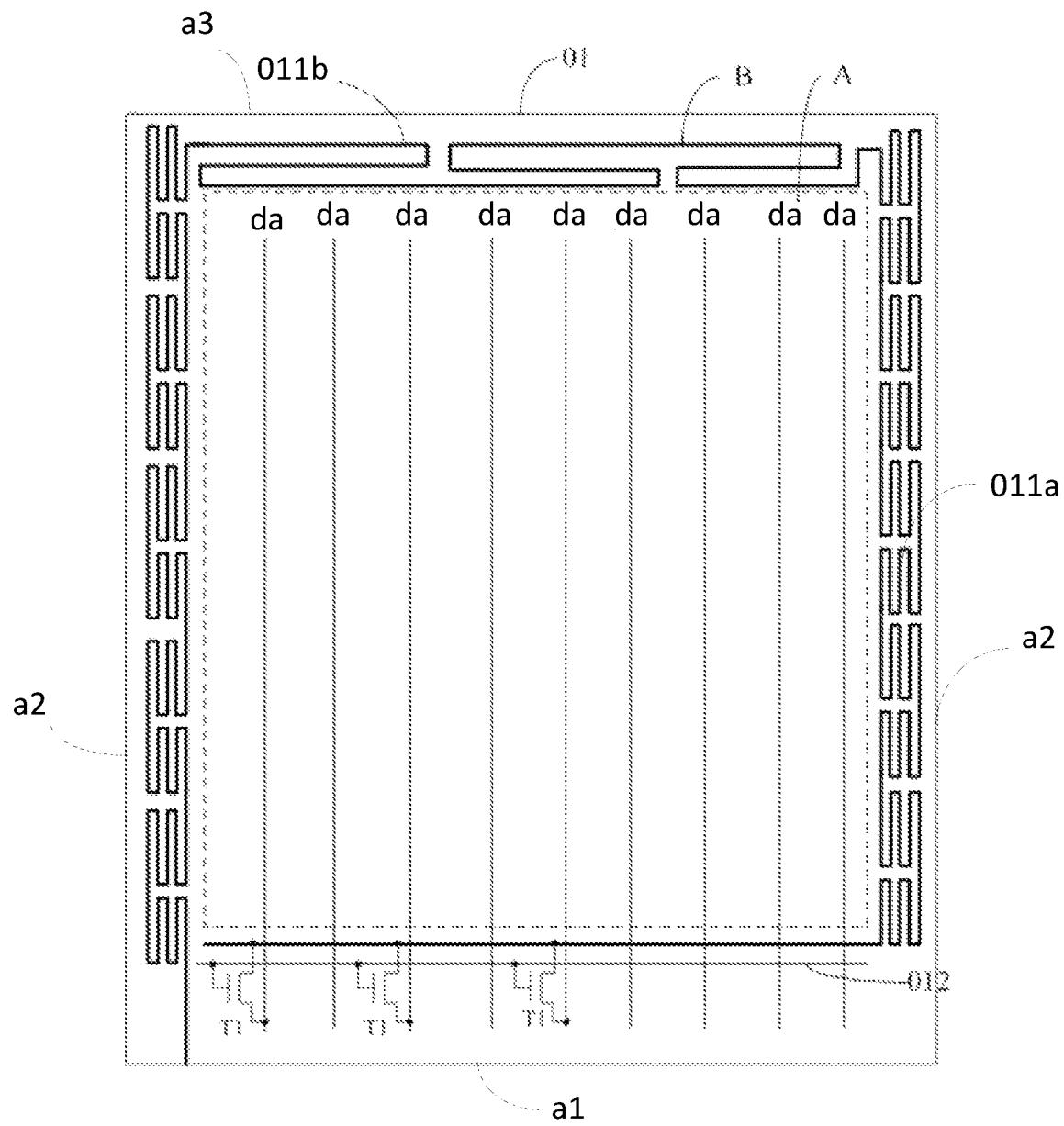
FIG. 5 is a fifth schematic structural diagram of an array substrate in accordance with an embodiment of the present disclosure.

Optionally, in the array substrate according to an embodiment of the present disclosure, as shown in FIG. 4 and FIG. 5, the peripheral area B is provided with one detection line.

The first segment 011a and the second segment 011b of the detection line at least surround the display area A by one circle.

In order to ensure that the part of the detection line at the first side is an effective detection area, the part of the first segment located at the first side of the peripheral area may be distributed circuitously.

Alternatively, in order to avoid affecting the detection of the entire array substrate after one detection line is broken, optionally, in the array substrate according to an embodiment of the present disclosure, as shown in FIG. 6 to FIG. 10, the peripheral area B is provided with two detection lines 011.

The first segment 011a and the second segment 011b of each of the detection lines 011 are located at the same side of the peripheral area B. That is, each of the detection lines 011 surrounds the display area A by a half circle.

Optionally, in the array substrate according to an embodiment of the present disclosure, as shown in FIG. 6 to FIG. 10, the two detection lines 011 are symmetrically disposed.

During specific implementation, in the array substrate according to an embodiment of the present disclosure, when the area occupied by the detection line in the peripheral area is larger and there are cracks, a resistance change on the detection line is more obvious, and the detection accuracy is higher. Therefore, optionally, in the array substrate according to an embodiment of the present disclosure, as shown in FIG. 5 to FIG. 7, the at least one detection line 011 is circuitously distributed in the peripheral area B.

Further, in the array substrate according to an embodiment of the present disclosure, in order to avoid the failure of crack detection after a detection line is broken, a plurality of detection lines may be disposed on each side of the array substrate. In this way, when one of the detection lines is broken, the other detection lines can implement crack detection.

Optionally, in the array substrate according to an embodiment of the present disclosure, sub-pixel units connected to data line connected to the first switching transistor are all green sub-pixel units. This is because human eyes are sensitive to green light, and when there are cracks, the light emitted from the green sub-pixel units is easily perceived by human eyes. During specific implementation, the color of the sub-pixel units connected to the data line connected to the first switching transistor is not limited.

Figure 8:
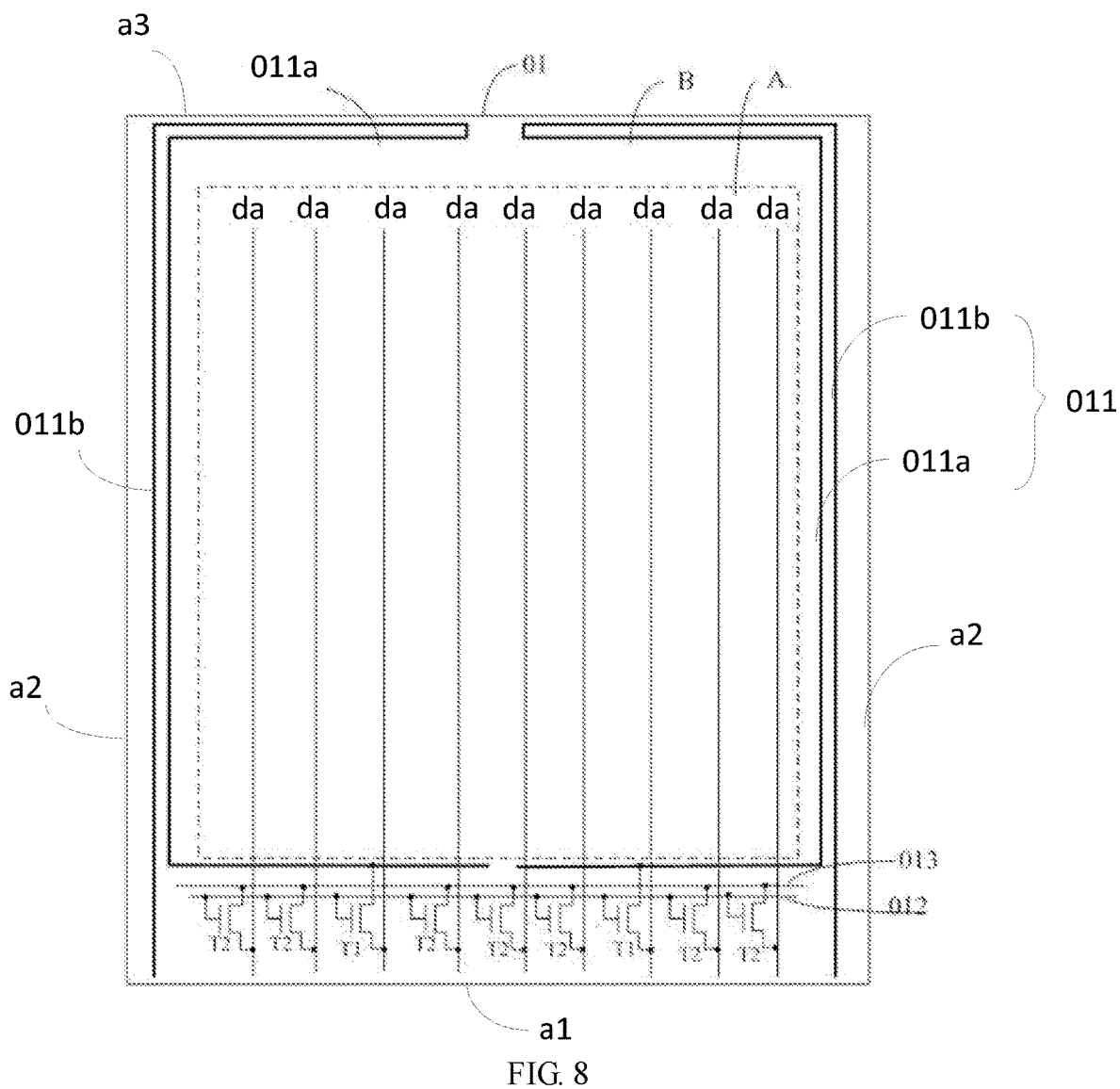
FIG. 8 is an eighth schematic structural diagram of an array substrate in accordance with an embodiment of the present disclosure.
Figure 9:
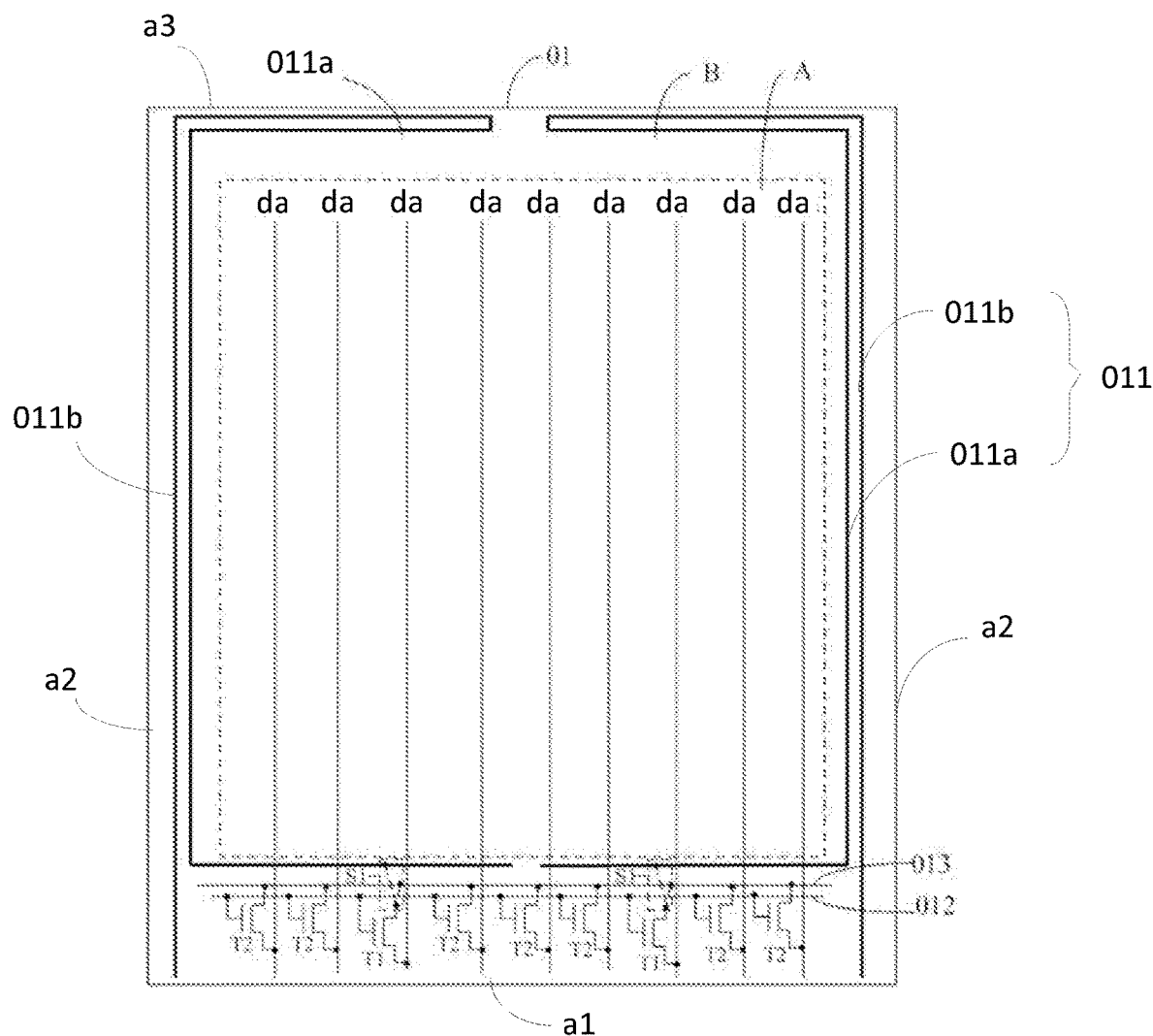
FIG. 9 is a ninth schematic structural diagram of an array substrate in accordance with an embodiment of the present disclosure.

Optionally, in the array substrate according to an embodiment of the present disclosure, as shown in FIG. 8 and FIG. 9, the array substrate further includes: second switching transistor T2 located in the peripheral area B and corresponding to the data line da except the first data line.

The source of the second switching transistor T2 is electrically connected to a display detection power supply line 013, the gate of the second switching transistor T2 is electrically connected to the gate control line 012, and the drain of the second switching transistor T2 is electrically connected to corresponding data line da.

During specific implementation, the second switching transistor and the display detection power supply line are configured to detect the sub-pixel units on the array substrate. When whether a sub-pixel unit can be lit or not is detected, a voltage is provided to the display detection power supply line, and when a difference between the voltage on the gate control line and the voltage on the display detection power supply line is smaller than a threshold voltage of the second switching transistor, the second switching transistor is turned off, and the corresponding sub-pixel units do not emit light. When the difference between the voltage on the gate control line and the voltage on the display detection power supply line is greater than the threshold voltage of the second switching transistor, the second switching transistor is turned on, and the corresponding sub-pixel units emit light.

Specifically, when the difference between the voltage on the gate control line and the voltage on the display detection power supply line is smaller than the threshold voltage of the second switching transistor, the corresponding sub-pixel units do not emit light. The preset voltage is applied to the detection line, and when the array substrate has cracks, the resistance on the detection line becomes larger, and the voltage applied to the source of the first switching transistor becomes smaller, so that the first switching transistor is turned on, and the sub-pixel units connected to the data line connected to the first switching transistor emit light, that is, there are bright lines on the array substrate. When the array substrate does not have cracks, the first switching transistor is turned off, and the sub-pixel units connected to the data line connected to the first switching transistor do not emit light, that is, the entire array substrate is a black screen.

Specifically, when the difference between the voltage on the gate control line and the voltage on the display detection power supply line is greater than the threshold voltage of the second switching transistor, the corresponding sub-pixel units emit light. The preset voltage is applied to the detection line, when the array substrate has cracks, the resistance on the detection line becomes larger, and the voltage applied to the source of the first switching transistor becomes smaller, so that the first switching transistor is turned on, the sub-pixel units connected to the first data line emit light, that is, the array substrate is a white screen. When the array substrate does not have cracks, the first switching transistor is turned off, and the sub-pixel units connected to the first data line do not emit light, that is, there are dark lines in the white screen of the array substrate.

Figure 10:
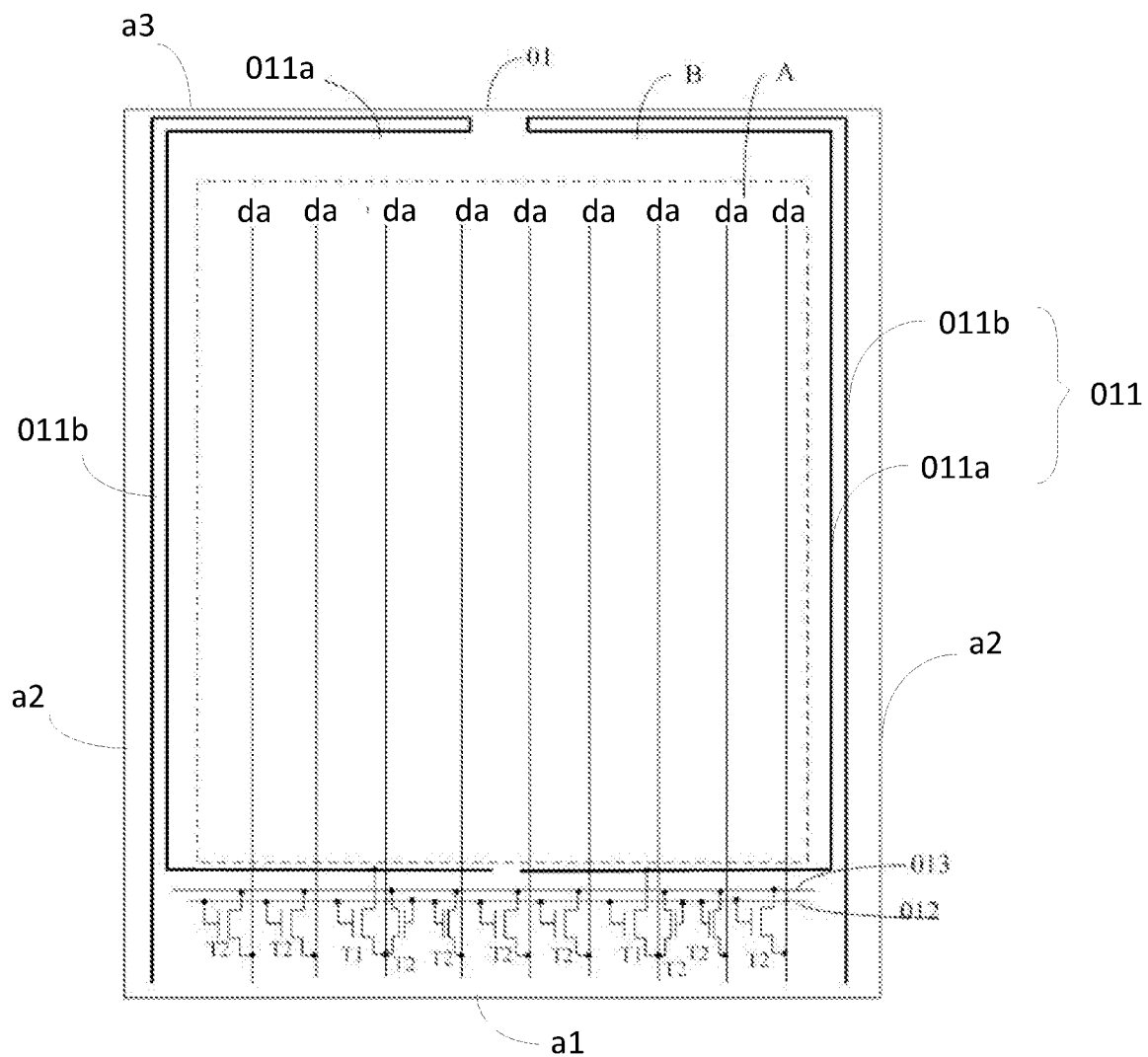
FIG. 10 is a tenth schematic structural diagram of an array substrate in accordance with an embodiment of the present disclosure.

Optionally, in the array substrate according to an embodiment of the present disclosure, as shown in FIG. 8 to FIG. 10, the first switching transistors T1 and the second switching transistors T2 are located at the first side a1 of the peripheral area B, that is, the first switching transistors T1 and the second switching transistors T2 are located on the same side of the peripheral area B to facilitate the electrical connection of the gate control line 012 with the first switching transistors T1 and the second switching transistors T2.

Optionally, in the array substrate according to an embodiment of the present disclosure, as shown in FIG. 9, each of the first switching transistors T1 is electrically connected to the corresponding detection line 011 through a selection control circuit S1.

The selection control circuit S1 is configured to control the source of the first switching transistor T1 to be connected with the detection line 011 when whether the array substrate has cracks or not is detected, and to control the source of the first switching transistor T1 to be connected with the display detection power supply line 013 when whether the array substrate displays normally or not is detected. In this way, whether each of the sub-pixel units on the array substrate emits light or not can be detected.

Optionally, in the array substrate according to an embodiment of the present disclosure, as shown in FIG. 8 to FIG. 10, the display detection power supply line 013 is in parallel with the gate control line 012.

Optionally, in the array substrate according to an embodiment of the present disclosure, in order to ensure that whether each of the sub-pixel units on the array substrate emits light or not can be detected, as shown in FIG. 10, a corresponding second switching transistor T2 is disposed for each data line, the sources of all second switching transistors T2 are connected to the display detection power supply line 013, the gates of all second switching transistors T2 are connected to the gate control line 012, the drains of all second switching transistors T2 are respectively connected to the corresponding data lines da.

Figure 14:
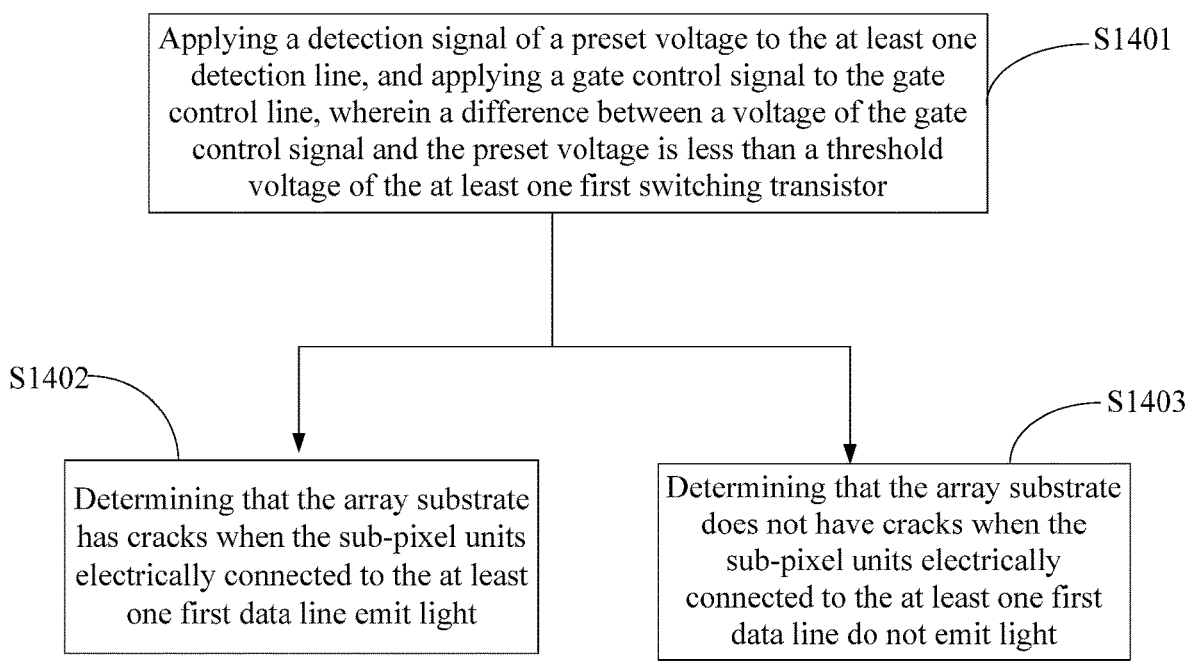
FIG. 14 is a flowchart of a detection method for an array substrate in accordance with an embodiment of the present disclosure.

Based on the same inventive concept, an embodiment of the present disclosure further provides a detection method for the array substrate, as shown in FIG. 14, including:

S1401, applying a detection signal of a preset voltage to the at least one detection line, and applying a gate control signal to the gate control line, wherein a difference between a voltage of the gate control signal and the preset voltage is less than a threshold voltage of the at least one first switching transistor;

S1402, determining that the array substrate has cracks when the sub-pixel units electrically connected to the at least one first data line emit light; and S1403, determining that the array substrate does not have cracks when the sub-pixel units electrically connected to the at least one first data line do not emit light.

Based on the same inventive concept, an embodiment of the present disclosure provides a display panel, including the array substrate according to any one of the above embodiments. The array substrate according to the above embodiments can be applied to a liquid crystal display panel, an OLED display panel or the like, which is not limited herein.

The effect of cracks on an OLED display panel is particularly important. Therefore, the array substrate according to an embodiment of the present disclosure is particularly suitable for an OLED display panel.

Figure 11:
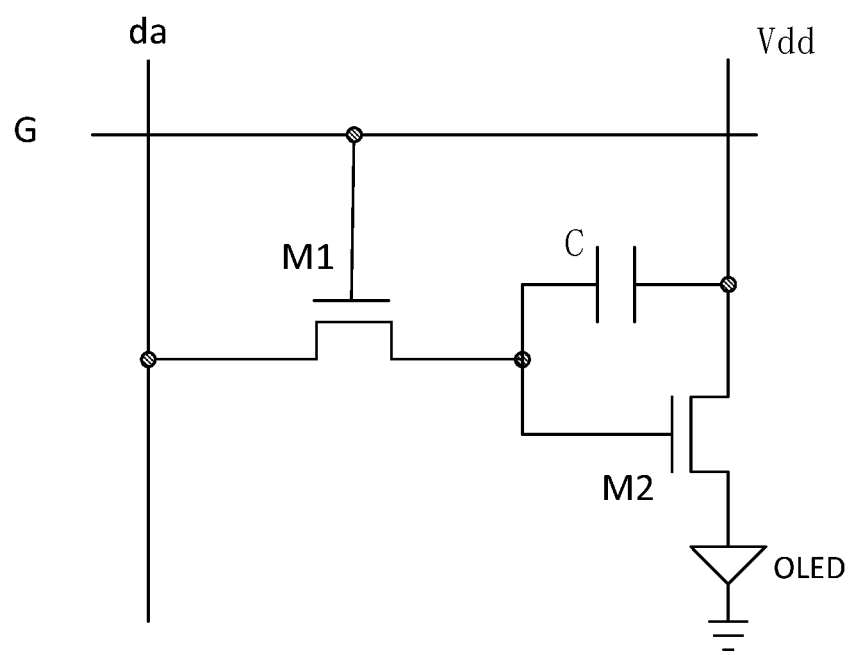
FIG. 11 is a schematic structural diagram of a pixel unit in an array substrate in accordance with an embodiment of the present disclosure.
Figure 12:
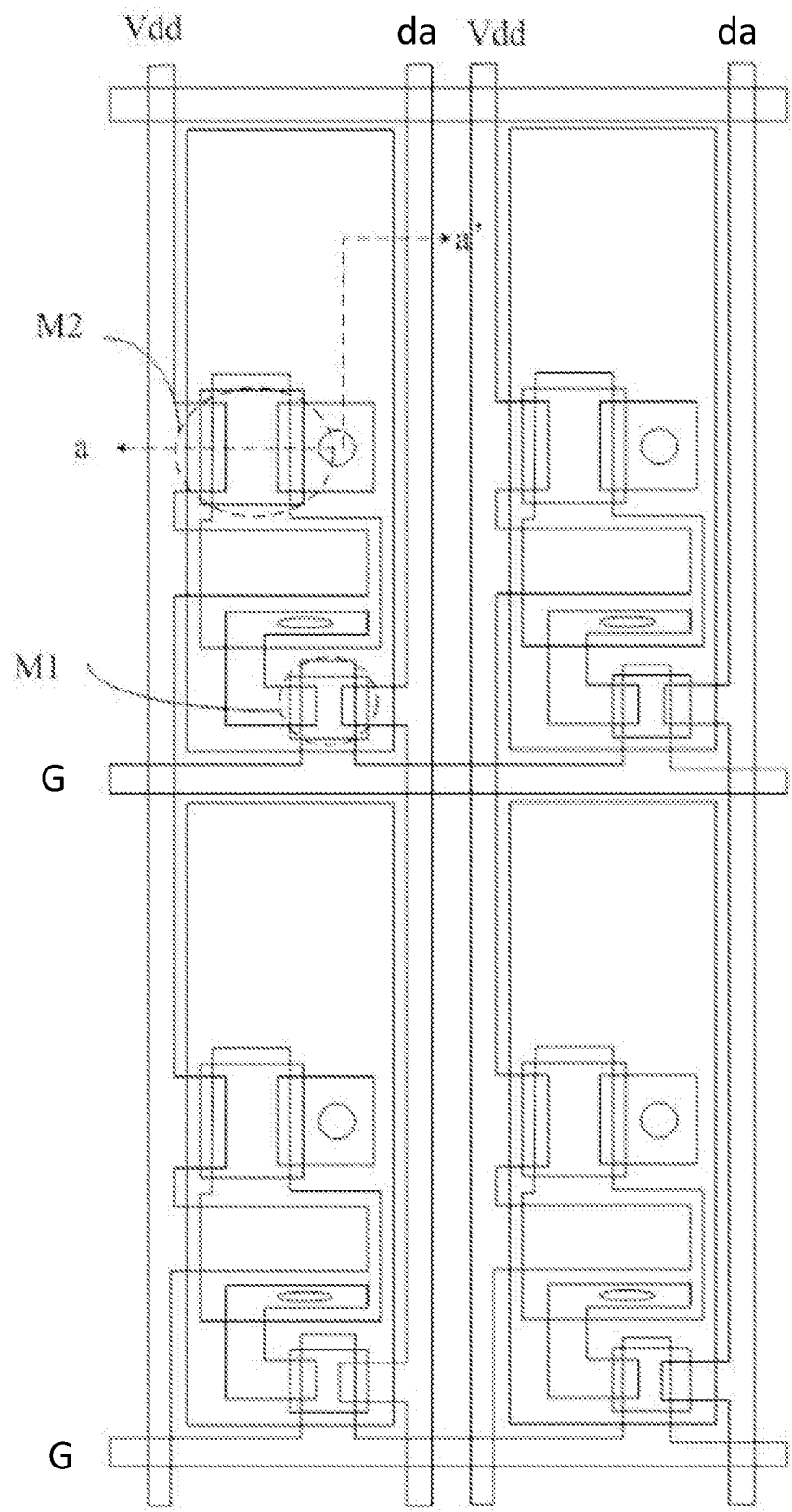
FIG. 12 is a schematic diagram showing a planar structure of a pixel unit in an array substrate in accordance with an embodiment of the present disclosure.

Specifically, when the array substrate is applied to an OLED display panel, a sub-pixel unit generally includes a pixel circuit, taking the most basic pixel circuit as an example, as shown in FIG. 11, including a switching transistor M1, a driving transistor M2, a storage capacitor C, and an OLED light emitting unit. The planar structure diagram of the sub-pixel unit is as shown in FIG. 12.

Figure 13:
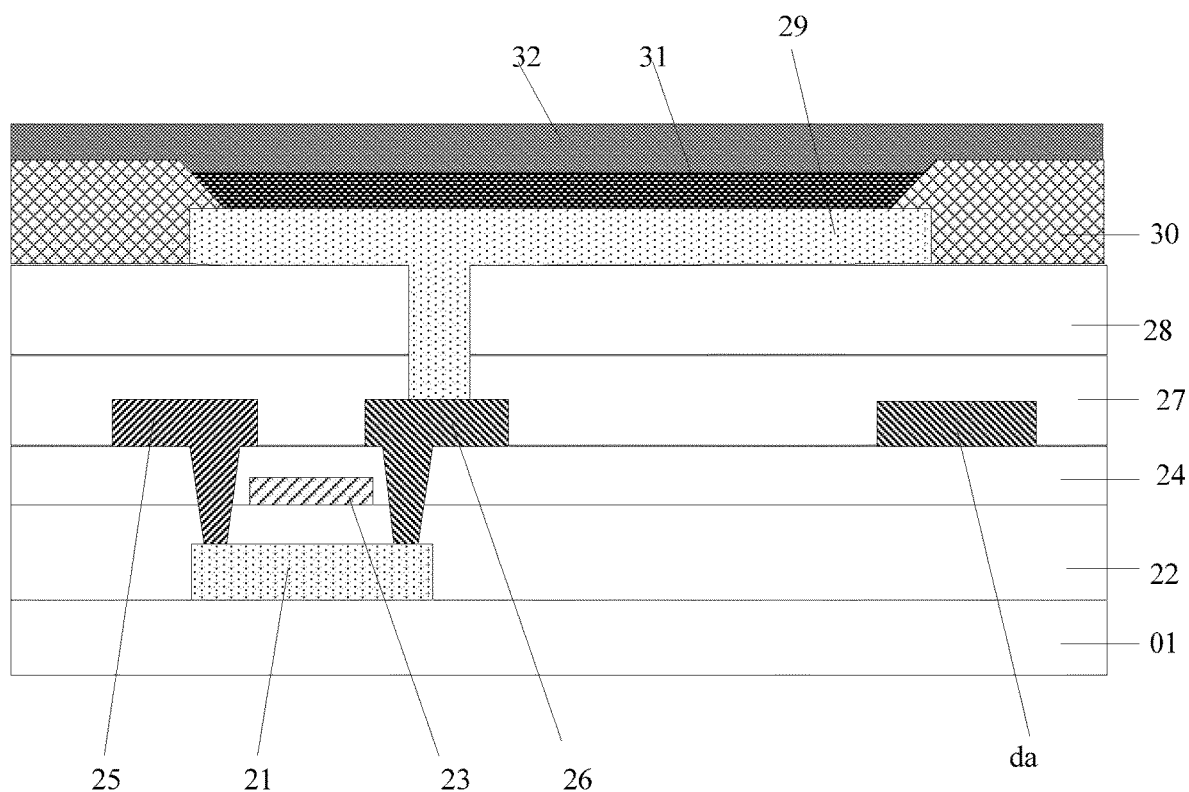
FIG. 13 is a cross-sectional structural view in a-a' direction of FIG. 12.

During specific implementation, a cross-sectional view of a pixel region according to an embodiment of the present disclosure is shown in FIG. 13, including a base substrate 01, an active layer 21, a gate insulating layer 22, a gate 23, an interlayer insulating layer 24, a source 25, a drain 26, a data line da, a passivation layer 27, a flattening layer 28, an anode 29, a pixel defining layer 30, a light emitting layer 31 and a cathode 32. The anode 29 is connected to the drain 26 through a via.

In an embodiment of the present disclosure, the active layer 21 may be a low-temperature polysilicon or an oxide, which is not limited herein.

In an embodiment of the present disclosure, the gate, the source and the drain may be prepared by using a metal material such as Cu, Al, Mo, Tl, Cr, or W or by using an alloy of these materials, and may be a single layer structure or a multilayer structure, such as Mo\Al\Mo, Tl\Cu\Tl or MoTi\Cu, which are not limited herein.

In an embodiment of the present disclosure, the gate insulating layer may be silicon nitride or silicon oxide; the gate insulating layer may be a single layer structure, and the gate insulating layer may also be a multilayer structure, such as silicon oxide\silicon nitride, which are not limited herein.

In an embodiment of the present disclosure, the interlayer insulating layer may be silicon nitride or silicon oxide; the interlayer insulating layer may be a single layer structure, and the gate insulating layer may also be a multilayer structure, such as silicon oxide\silicon nitride, which are not limited herein.

In an embodiment of the present disclosure, the passivation layer may be silicon nitride or silicon oxide; the passivation layer may be a single layer structure, and the gate insulating layer may also be a multilayer structure, such as silicon oxide\silicon nitride, which are not limited herein.

In an embodiment of the present disclosure, the flattening layer may be prepared by using a resin material, and the pixel defining layer may be prepared by using a resin material, which are not limited herein.

In an embodiment of the present disclosure, the anode may be prepared by using ITO or ITO/Ag/ITO, which is not limited herein.

In an embodiment of the present disclosure, the cathode may be prepared by using Al or Ag, which is not limited herein.

Based on the same inventive concept, an embodiment of the present disclosure further provides a display device, including a display panel according to an embodiment of the present disclosure. The display device is similar to the foregoing array substrate and display panel in the principle of solving the problem. Therefore, the implementation of the display device can be referred to the implementation of the foregoing array substrate and display panel, and the repeated description is omitted.

During specific implementation, the display device may be any product or component having a display function, such as a mobile phone, a tablet computer, a television, a display, a notebook computer, a digital photo frame, a navigator, which is not limited herein.

According to the array substrate and the detection method therefor, the display panel, and the display device according to embodiments of the present disclosure, at least one detection line and at least one first switching transistor connected to the detection line are disposed in the peripheral area, wherein the source of the first switching transistor is connected to the detection line, the drain of the first switching transistor is connected to the first data line, and the gate of the first switching transistor is electrically connected to the gate control line. When whether the array substrate has cracks or not is detected, a detection signal of a preset voltage is applied to the detection line, and a gate control signal is applied to the gate control line, wherein a difference between a voltage of the gate control signal and the preset voltage is less than a threshold voltage of the first switching transistor; when the array substrate has cracks in an area where the detection line passes, the detection line is thinned with the crack, so that the resistance on the detection line becomes larger, and the voltage applied to the source of the first switching transistor becomes smaller to cause the first switching transistor to be turned on, so the sub-pixel units connected to the first data line emit light; when the array substrate does not have cracks in an area where the detection line passes, the at least one first switching transistor is turned off, so the sub-pixel units connected to the first data line do not emit light. Therefore, whether the array substrate has cracks or not is detected by the fact that the resistance on the detection line changes with the crack.

Obviously, those skilled in the art can make various modifications and variations to the present disclosure without departing from the spirit and scope of the present disclosure. Thus, if these modifications and variations of the present disclosure fall within the scope of the claims of the present disclosure and the equivalents thereof, the present disclosure also intends to include these modifications and variations.

The invention claimed is:

1. An array substrate, comprising:
    a base substrate, wherein the base substrate has a display area and a peripheral area surrounding the display area;
    a plurality of sub-pixel units, wherein the plurality of sub-pixel units are arrayed in the di splay area;
    a plurality of data lines, wherein the data lines are electrically connected to the sub-pixel units in corresponding columns;
    at least one first switching transistor, wherein the at least one first switching transistor is at a first side of the peripheral area, a drain of the first switching transistor is electrically connected to one of the data lines, and the one of the data lines connected to the drain of the first switching transistor is a first data line;
    a gate control line, wherein the gate control line is at the first side of the peripheral area, and the gate control line is electrically connected to a gate of the first switching transistor; and
    at least one detection line, wherein the at least one detection line is at least at the first side and a second side of the peripheral area, the first side and the second side are adjacent sides, and the at least one detection line is electrically connected to a source of the at least one first switching transistor;
    wherein the array substrate further comprises: second switching transistors in the peripheral area and corresponding to the data lines except at least one first data line;
    sources of the second switching transistors are electrically connected to a display detection power supply line, gates of the second switching transistors are electrically connected to the gate control line, and drains of the second switching transistors are electrically connected to corresponding data lines;

wherein each first switching transistor is electrically connected to the corresponding detection line through a selection control circuit; and the selection control circuit is configured to control the sources of the first switching transistors to be connected with the detection lines when whether the array substrate has cracks or not is detected, and to control the sources of the first switching transistors to be connected with the display detection power supply line when whether the array substrate displays normally or not is detected.

2. The array substrate according to claim 1, wherein the at least one first switching transistor is at a first end of the corresponding first data line; and the at least one detection line comprises a first segment extending from the first end of the first data line along the first side, the second side and a third side of the peripheral area to a second end of the first data line, and the third side is a side opposite to the first side.

3. The array substrate according to claim 2, wherein a signal input end of the at least one detection line is at the first side; the at least one detection line further comprises a second segment extending from the second end of the first data line along the third side, the second side and the first side of the peripheral area to the signal input end.

4. The array substrate according to claim 3, wherein a part of the at least one detection line at the second side of the peripheral area is provided with a plurality of circuitous trace portions.

5. The array substrate according to claim 4, wherein the circuitous trace portions are at the second segment.

6. The array substrate according to claim 3, wherein the peripheral area is provided with one detection line; and the first segment and the second segment of the at least one detection line at least surround the display area by one circle.

7. The array substrate according to claim 6, wherein a part of the first segment at the first side of the peripheral area is distributed circuitously.

8. The array substrate according to claim 3, wherein the peripheral area is provided with two detection lines; and the first segment and the second segment of each of the detection lines are at the same side of the peripheral area.

9. The array substrate according to claim 8, wherein the two detection lines are symmetrically disposed.

10. The array substrate according to claim 1, wherein the same detection line is electrically connected to sources of a plurality of first switching transistors.

11. The array substrate according to claim 1, wherein sub-pixel units electrically connected to at least one first data line are green sub-pixel units.

12. The array substrate according to claim 1, wherein the first switching transistors and the second switching transistors are at the first side of the peripheral area.

13. The array substrate according to claim 12, wherein the display detection power supply line is in parallel with the gate control line.

14. A detection method for the array substrate according to claim 1, comprising:

applying a detection signal of a preset voltage to the at least one detection line, and applying a gate control signal to the gate control line, wherein a difference between a voltage of the gate control signal and the preset voltage is less than a threshold voltage of the at least one first switching transistor;

determining that the array substrate has cracks when the sub-pixel units electrically connected to the at least one first data line emit light, and determining that the array substrate does not have cracks when the sub-pixel units electrically connected to the at least one first data line do not emit light.

15. A display panel, comprising the array substrate according to claim 1.

16. The display panel according to claim 15, wherein the display panel is an organic electroluminescence display panel.

17. A display device, comprising the display panel according to claim 15.

* * * * *